United States Patent
Schneider et al.

(10) Patent No.: US 11,469,223 B2
(45) Date of Patent: Oct. 11, 2022

(54) HIGH PRECISION SWITCHED CAPACITOR MOSFET CURRENT MEASUREMENT TECHNIQUE

(71) Applicant: Analog Devices International Unlimited Company, Limerick (IE)

(72) Inventors: David F. Schneider, Sanford, NC (US); Trevor W. Barcelo, Andover, MA (US)

(73) Assignee: Analog Devices International Unlimited Company, Limerick (IE)

( * ) Notice: Subject to any disclaimer, the term of this patent is extended or adjusted under 35 U.S.C. 154(b) by 232 days.

(21) Appl. No.: 16/860,598

(22) Filed: Apr. 28, 2020

(65) Prior Publication Data

US 2020/0381418 A1 Dec. 3, 2020

Related U.S. Application Data

(60) Provisional application No. 62/855,041, filed on May 31, 2019.

(51) Int. Cl.
*H01L 27/02* (2006.01)
*G01R 19/00* (2006.01)

(52) U.S. Cl.
CPC ...... *H01L 27/0288* (2013.01); *G01R 19/0092* (2013.01)

(58) Field of Classification Search
CPC ............ H01L 27/0288; G01R 19/0092; G01R 19/16571; G01R 19/16519; G01R 19/25; H03K 17/161
See application file for complete search history.

(56) References Cited

U.S. PATENT DOCUMENTS

| | | | |
|---|---|---|---|
| 7,171,171 B1* | 1/2007 | Coffman | H03G 3/3047 |
| | | | 455/127.1 |
| 10,459,468 B1* | 10/2019 | Ankamreddi | H03K 17/0822 |
| 10,601,259 B2* | 3/2020 | Piasecki | H02J 50/12 |
| 2002/0015272 A1 | 2/2002 | Hattori | |
| 2009/0115493 A1* | 5/2009 | Akamatsu | G11C 17/18 |
| | | | 327/525 |
| 2009/0295359 A1 | 12/2009 | Del | |
| 2017/0256532 A1* | 9/2017 | Lidsky | H02H 3/202 |
| 2017/0328934 A1 | 11/2017 | Mayell | |
| 2018/0123578 A1* | 5/2018 | Chauhan | H03K 17/687 |
| 2019/0190252 A1* | 6/2019 | Hanagami | H02H 3/18 |
| 2019/0260376 A1* | 8/2019 | Zuniga | H02M 3/156 |
| 2020/0059212 A1* | 2/2020 | Raimar | H03F 3/45179 |
| 2021/0148956 A1* | 5/2021 | Jan | G01R 1/203 |

FOREIGN PATENT DOCUMENTS

CN 112014628 A 12/2020

OTHER PUBLICATIONS

"European Application Serial No. 20176182.2, Extended European Search Report dated Oct. 26, 2020", 13 pgs.

* cited by examiner

*Primary Examiner* — Dominic E Hawkins
(74) *Attorney, Agent, or Firm* — Schwegman Lundberg & Woessner, P.A.

(57) ABSTRACT

A current monitor circuit comprises a sense transistor disposed in a first voltage domain; a reference transistor disposed in a second voltage domain isolated from the first voltage domain; and sensing circuitry configured to determine if a current in the sense transistor is greater than or less than a specified current using a current in the reference transistor.

20 Claims, 9 Drawing Sheets

US 11,469,223 B2

HIGH PRECISION SWITCHED CAPACITOR MOSFET CURRENT MEASUREMENT TECHNIQUE

CLAIM OF PRIORITY

This application claims the benefit of priority to U.S. Provisional Patent Application No. 62/855,041, filed. May 31, 2019, which is incorporated herein by reference in its entirety.

FIELD OF THE DISCLOSURE

This document relates to integrated circuits and in particular to using an isolated transistor as a control element in integrated circuits.

BACKGROUND

An isolated transistor can be used as a control element in many circuit applications. For example, isolated transistors can be used in power electronics for switches, multiplexers (muxes), circuit breakers, ideal diodes, current or power limiters, hot swap functions, battery charger applications, etc. It would be desirable to have a measurement technique for controlling an isolated transistor that operates independent of the common-mode voltage of the application.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

An isolated transistor can be used as a control element in integrated circuits. In a specific example, electronic circuit breaker (ECB) circuits can be used to connect a supply to a load if the current is below a pre-determined threshold, and to disconnect the supply from that load if the current is above a pre-determined threshold.

Figure 1:
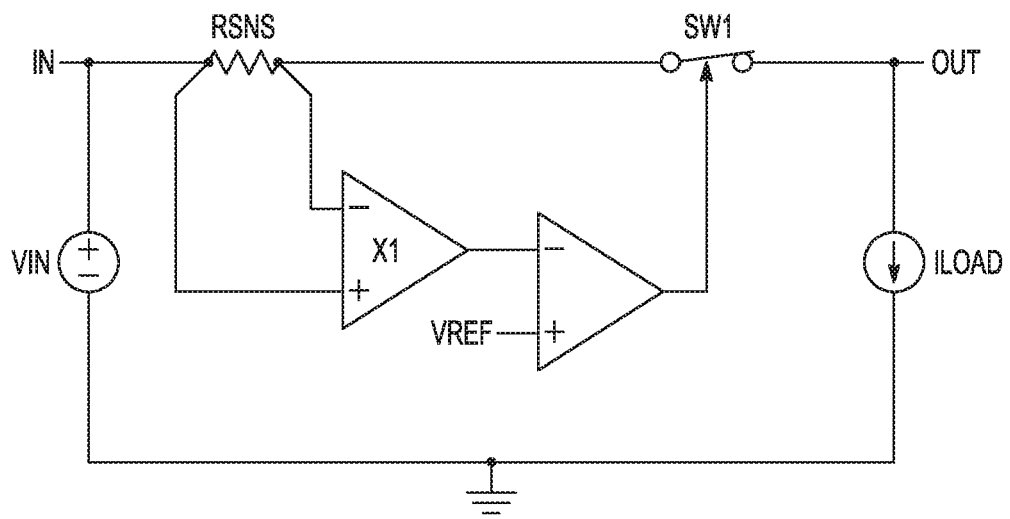
FIG. 1 is a block diagram of an example of an electronic circuit breaker (ECB) circuit.

FIG. 1 is a block diagram of an example of an ECB circuit using ideal circuit elements. The ECB circuit includes a sense resistor RSNS, a switch SW1, a buffer and a comparator. Switch SW1 is ON or closed when ILOAD<VREF/RSNS and SW1 is OFF or open when ILOAD>VREF/RSNS. A practical implementation of the ECB circuit would replace switch SW1 with a transistor. However, consider an ECB where the input voltage VIN could be a high positive voltage, a voltage near ground, or a negative voltage. It would be desirable to have a measurement technique for an ECB that operates independent of the common-mode voltage of the switched current path (from IN to OUT in FIG. 1). Furthermore, it would be advantageous to eliminate the voltage drop and power dissipation associated with the current sense resistor RSNS.

Figure 2:
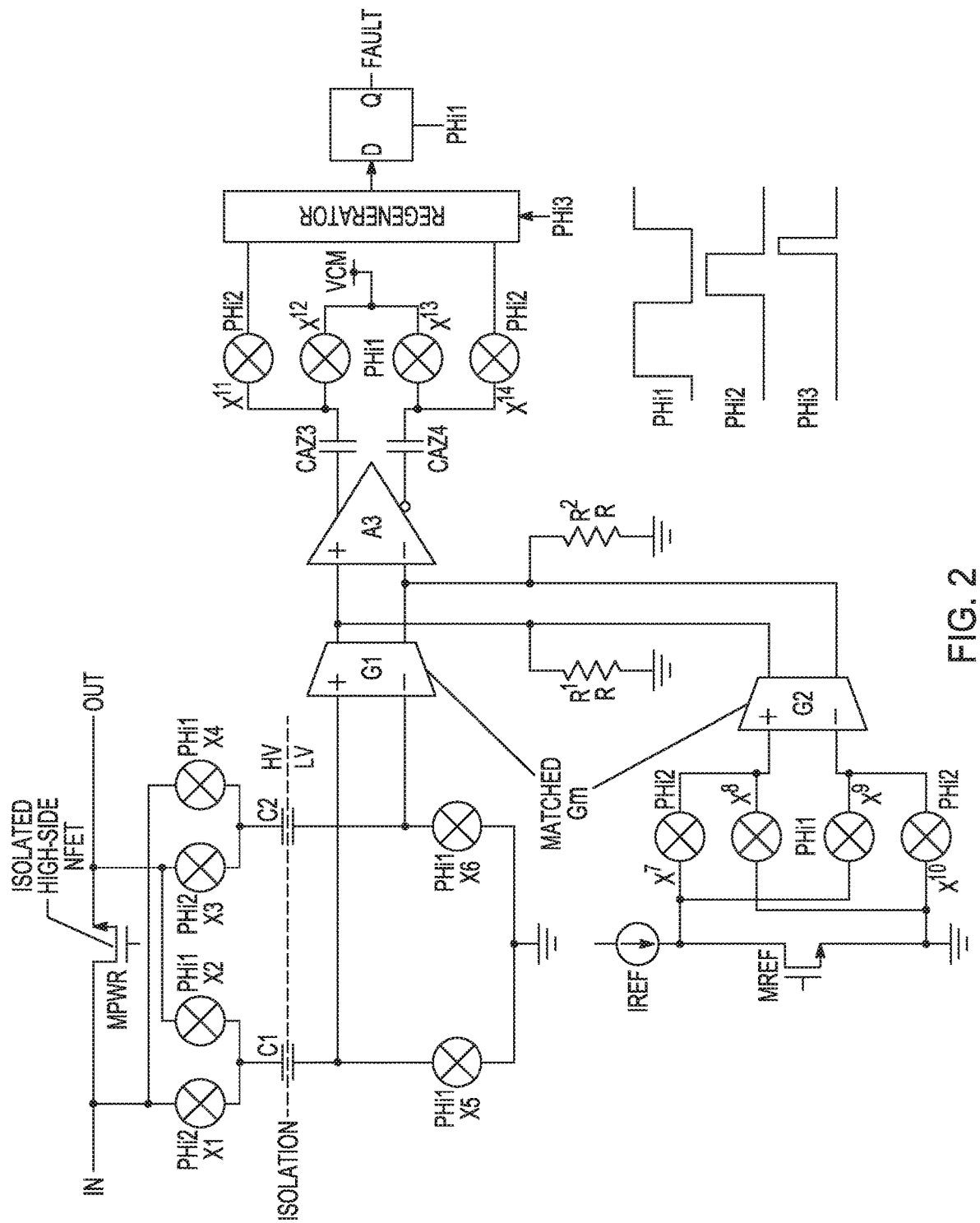
FIG. 2 is a circuit diagram of another example of an ECB circuit.

FIG. 2 is a circuit diagram of another example of an ECB circuit. The circuit performs a circuit-breaker function as in the example shown in FIG. 1 but switch SW1 between the input node IN and the output node OUT is replaced by a field effect transistor (FET) MPWR. The current sense resistor RSNS, buffer, and comparator in FIG. 1 are replaced with different monitoring circuitry in FIG. 2. Transistor MPWR, switches X1, X2, X3, X4, and capacitors C1, C2 of the monitoring circuitry are located in a different voltage domain than the rest of the monitoring circuitry. In the example of FIG. 2, transistor MPWR, switches X1, X2, X3, X4, and capacitors C1, C2 of the monitoring circuitry are located in a higher voltage (HV) region of the circuit, and the rest of the monitoring circuitry is located in a lower voltage (LV) region of the circuit. The HV domain and the LV domain are separated by an isolation structure.

Shown in the lower right corner of FIG. 2 is a timing diagram for the three phases of the switched capacitor circuitry, During the first phase, Phi 1, the input common-mode of the output voltage VOUT is sampled on both of isolation capacitors C10 and C2. Simultaneously, all amplifiers (G1, G2, and A3) are auto-zeroed. The gained offset voltages of G1, G2 and A3 are summed and stored on auto zero (AZ) capacitors CAZ3 and CAZ4. The "output" common-mode of the AZ capacitors is set to common mode voltage VCM using switches X12 and X13. It should be noted that the combined gain of G1 and G2 into resistors R1, R2 and amplifier A3 is relatively small (e.g., gain is in a range of 5-100, depending on expected input signal range). Capacitors C1, C2 and CAZ3, CAZ4 are matched capacitor pairs.

FIG. 2 also includes reference transistor MREF and a regenerator circuit. During the second phase, Phi2, the voltage on C2 does not change, but the Vds of MPWR is differentially presented to the inputs of G1 via C1 and C2. Simultaneously, the drain-to-source voltage (Vds) of MREF is connected to the inputs of G2. In an integrated circuit implementation, MPWR can be designed to be a multiple, α, of many MREF devices in parallel (e.g., α=20,000). A reference current (IREF) is forced through reference transistor MREF. To a first order, this ensures that the Vds of MREF equals the Vds of MPWR when the current of MPWR is a times IREF independent of temperature and process variations. In addition, G1 and G2 are designed to be matching transconductance amplifiers with equal transconductance.

The regenerator circuit includes a comparator circuit and circuitry that reduces noise at the output of the regenerator circuit. During Phi2, the gained up Vds of MREF is subtracted from the gained up Vds of MPWR and presented to the inputs of the regenerator circuit via CAZ3 and CAZ4. It should be noted that CAZ3 and CAZ4 previously stored the offset information from the autozeroing action of Phi1 providing high accuracy even when the Vds being measured is very small.

During the final phase, Phi 3, the regenerator circuit is powered to decide whether the Vds of MPWR is smaller or larger than the Vds of MREF. This comparison decision is latched on the next rising edge of Phi1. Transistors MPWR and MREF are fabricated in a precise ratio (e.g., 20,000 to 1). Because of the ratio between MREF and MPWR, this comparison of the Vds of the two devices is equivalent to comparing the current of MPWR to α times IREF (αIREF). The Vds of MPWR being greater than VDS of MREF indicates that the current in MPWR is higher than the desired trip current level. The output of the latch can then be used to turn transistor MPWR off in the event of a fault.

There are several benefits to the circuit topology of FIG. 2. An obvious benefit is that no series sense resistor (RSNS) is required for current measurement. This eliminates the voltage drop and power dissipation associated with a sense resistor. Another primary benefit of this topology is that all circuitry can be implemented using low voltage devices except for MPWR, MREF, C1 and C2 (as well as a few level-shifting capacitors required to drive switches X1, X2, X3 and X4). In other words, if the signal processing circuitry is powered from a low voltage bias supply (e.g., supply $V_{DD}$), but the input common mode voltage is high (e.g. 12 Volts (12V), or 40V, or 60V), then components MPWR, MREF, C1, and C2 need to handle the maximum input voltage, but all other circuitry can be low voltage consistent with $V_{DD}$ (e.g., 2.7V or 3.3V or 5V). The use of low voltage devices makes the circuit topology easily adaptable to many different voltage levels by simply changing the power device (MPWR), reference device (MREF), and isolation capacitors (C1, C2).

In addition, the circuit topology works equally well for high common-mode input voltages, very low common-mode input voltages (e.g. near 0V) or even negative common-mode voltages. Provided C1 and C2 have no polarity concerns, the level-translation of the Vds of MPWR to the low voltage ($V_{DD}$) domain will work independent of input/output common-mode.

Another significant benefit of the topology is that this current measuring technique does not perturb the switched current path ON to OUT) in a meaningful way. The average current drawn from IN or OUT can be well under 100 nano-Amperes (100 nA) without affecting circuit operation. While operating the switched capacitor circuitry at very high frequency does increase current consumption, this current is provided by $V_{DD}$ and not from IN or OUT. Finally, the architecture can be modified to work for current flowing in either direction.

Figure 3:
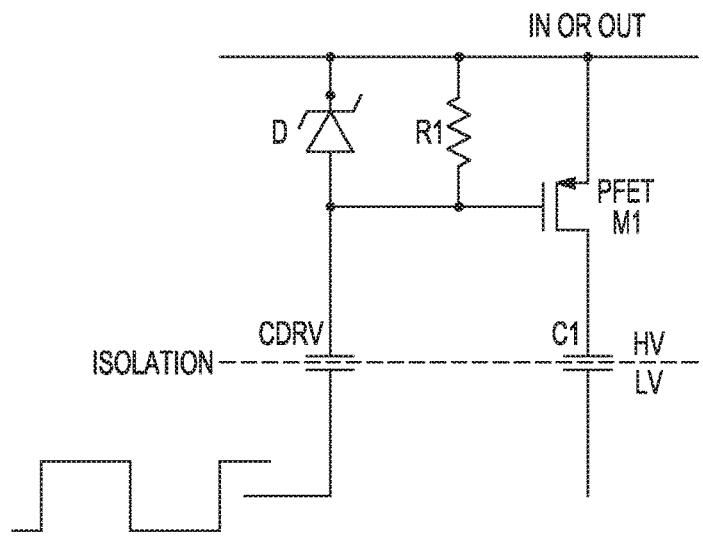
FIG. 3 is a circuit diagram of a drive circuit to drive switches of the ECB circuit of FIG. 2.

FIG. 3 is a circuit diagram of a drive circuit to drive the switches X1, X2, X3, X4, on the HV side of the circuit in FIG. 2, The P-channel FET (PET) M1 corresponds to any of switches X1, X2, X3, or X4 in FIG. 2. Capacitor C1 in FIG. 3 corresponds to capacitor C1 in FIG. 2. The drive circuit of FIG. 3 uses all low voltage devices except for isolation capacitor CDRV which needs to withstand the maximum input/output common-mode voltage. The average current consumption of the drive is determined by Von and not by the IN or OUT nodes.

Figure 4:
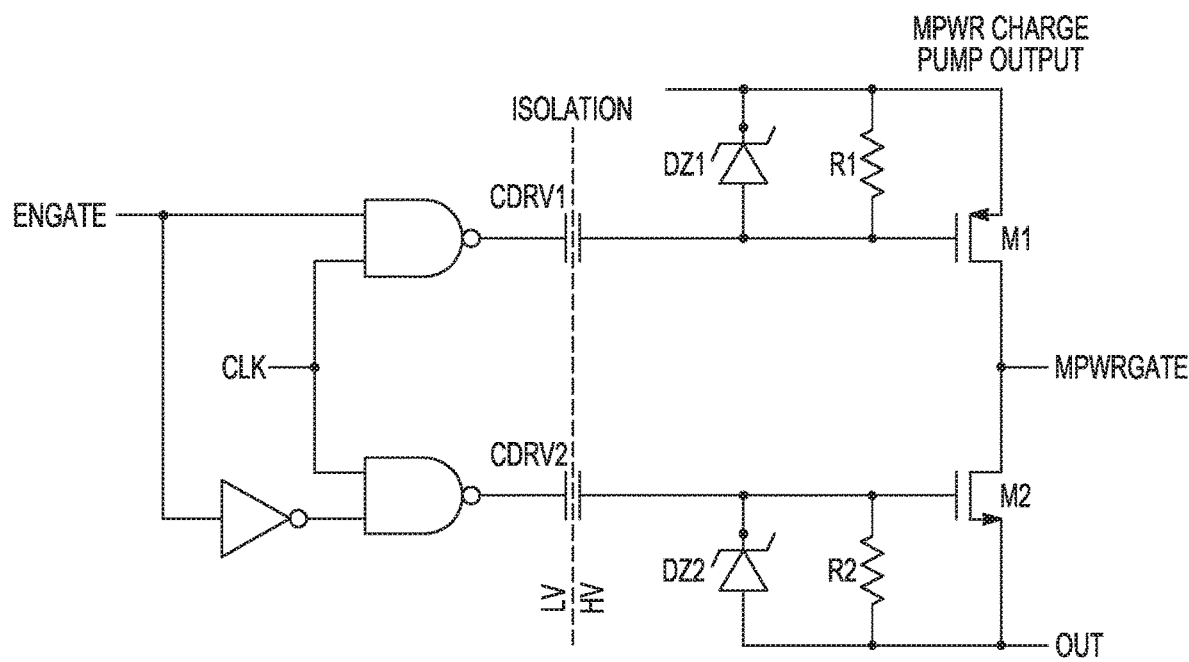
FIG. 4 is a circuit diagram of a drive circuit to drive transistors of the ECB circuit of FIG. 2.

FIG. 4 is a circuit diagram of a drive circuit to drive switch transistor MPWR. Signal MPWRGATE in FIG. 4 is applied to the gate connection of transistor MPWR. A complication for the circuit topology of the drive circuit for MPWR is that, while the circuit of FIG. 2 will work with a variety of technologies for MPWR, it is often desirable to use an N-channel metal-oxide semiconductor field effect transistor (MOSFET) due to its high conductivity for MPWR (and MREF). This requires a boost circuit to generate a gate-to-source voltage (Vgs) for MPWR above the output voltage VOUT. Rather than boosting $V_{DD}$ to reach a suitable Vgs above VOUT, a better approach is to use charge pump techniques to stack $V_{DD}$ (or 2 times $V_{DD}$) on top of VOUT to provide Vgs for MPWR.

Another complication for the circuit topology of the drive circuit for MPWR and for MREF is that in the current measurement technique of FIG. 2, the Vgs of MREF and the Vgs of MPWR should be substantially the same, but the Vgs of MPWR will be referenced to node OUT while the Vgs of MREF will be referenced to ground. A technique to match the Vgs of MPWR to the Vgs of MREF is to use two regulated charge pumps—one for MPWR and one for MREF. The charge pump for MPWR would stack $V_{DD}$ (e.g., 2 times $V_{DD}$) on top of VOUT while the charge pump for MREF would simply stack $V_{DD}$ (e.g., 2 times $V_{DD}$) on top of ground. With a matching regulation network on each charge pump, the Vgs of each device MPWR, MREF can be the same.

Another technique to match technique Vgs of MPWR to Vgs of MREF is to use a single charge pump to stack $V_{DD}$ (e.g., 2 times $V_{DD}$) on top of VOUT to provide Vgs for MPWR, and then, use a one-to-one (1:1) charge pump to level shift that same Vgs back down to ground to drive MREF. Other techniques to match Vgs of MPWR to the Vgs of MREF are possible. Once a voltage sufficient to drive MPWR is available, the technique for driving the circuit of FIG. 4 can be used to drive MPWR on and off.

Figure 5:
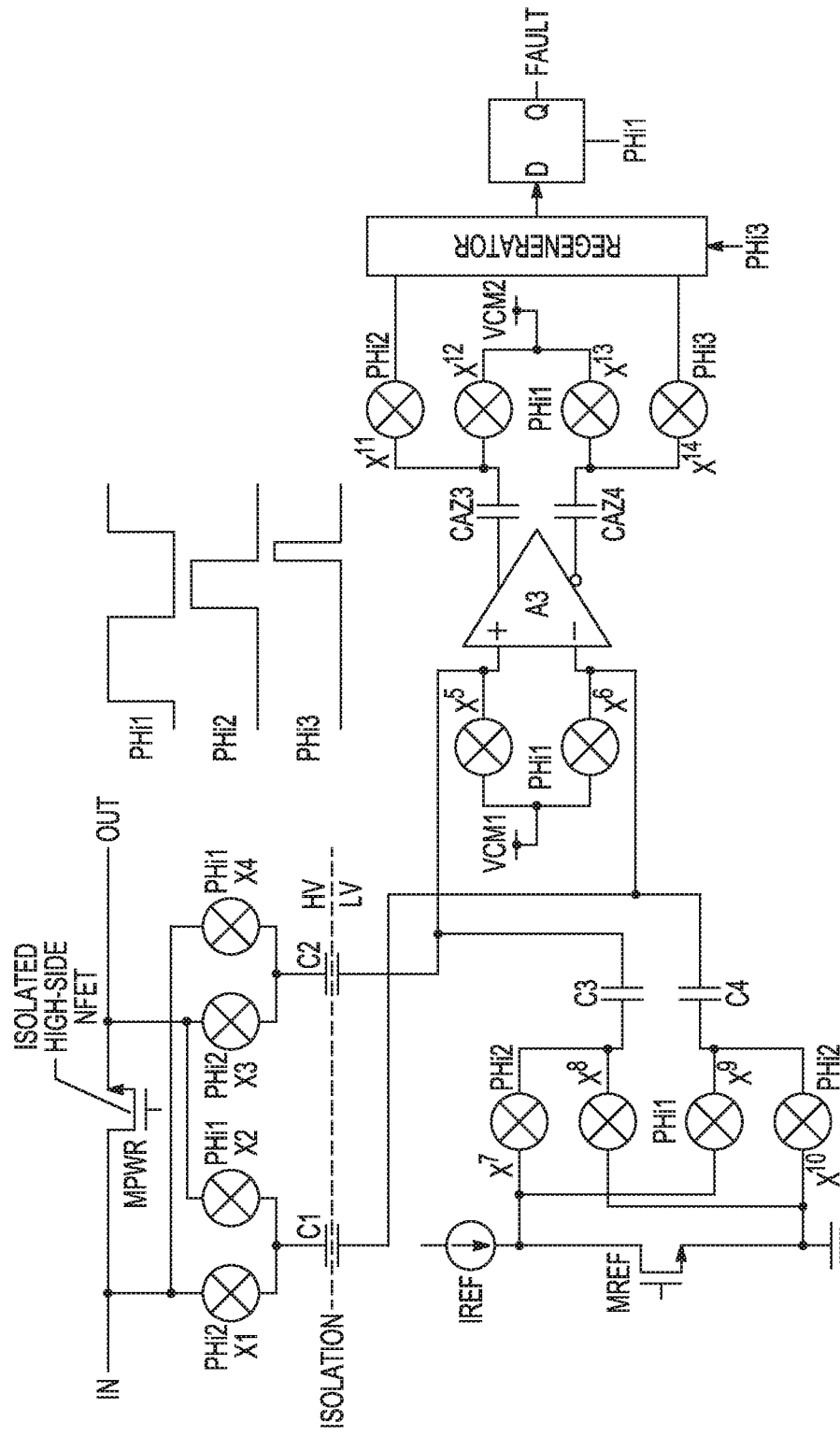
FIG. 5 is a circuit diagram of another example of an ECB circuit.

FIG. 5 is a circuit diagram of another example of an ECB circuit. The circuit approach of FIG. 5 uses another pair of capacitors C3, C4 matched to capacitors C1, C2 to implement a fully differential circuit using the concepts of the example of FIG. 2. Switches X1, X2, X3, X4 and X7, X8, X9, X10 act as Vds commutators for MPWR and MREF, respectively. The signal presented to amplifier A3 is doubled with respect to FIG. 2, and the amplification stages are slightly simplified by removal of transconductance amplifiers G1 and G2. Shown in the upper right corner of FIG. 5 is a timing diagram for the two phases of the switched capacitor circuitry of FIG. 5.

While the circuits of FIG. 2 and FIG. 5 are example of ECB circuits, the front-end signal processing techniques can be used in other applications to provide the advantages described previously herein.

Figure 6:
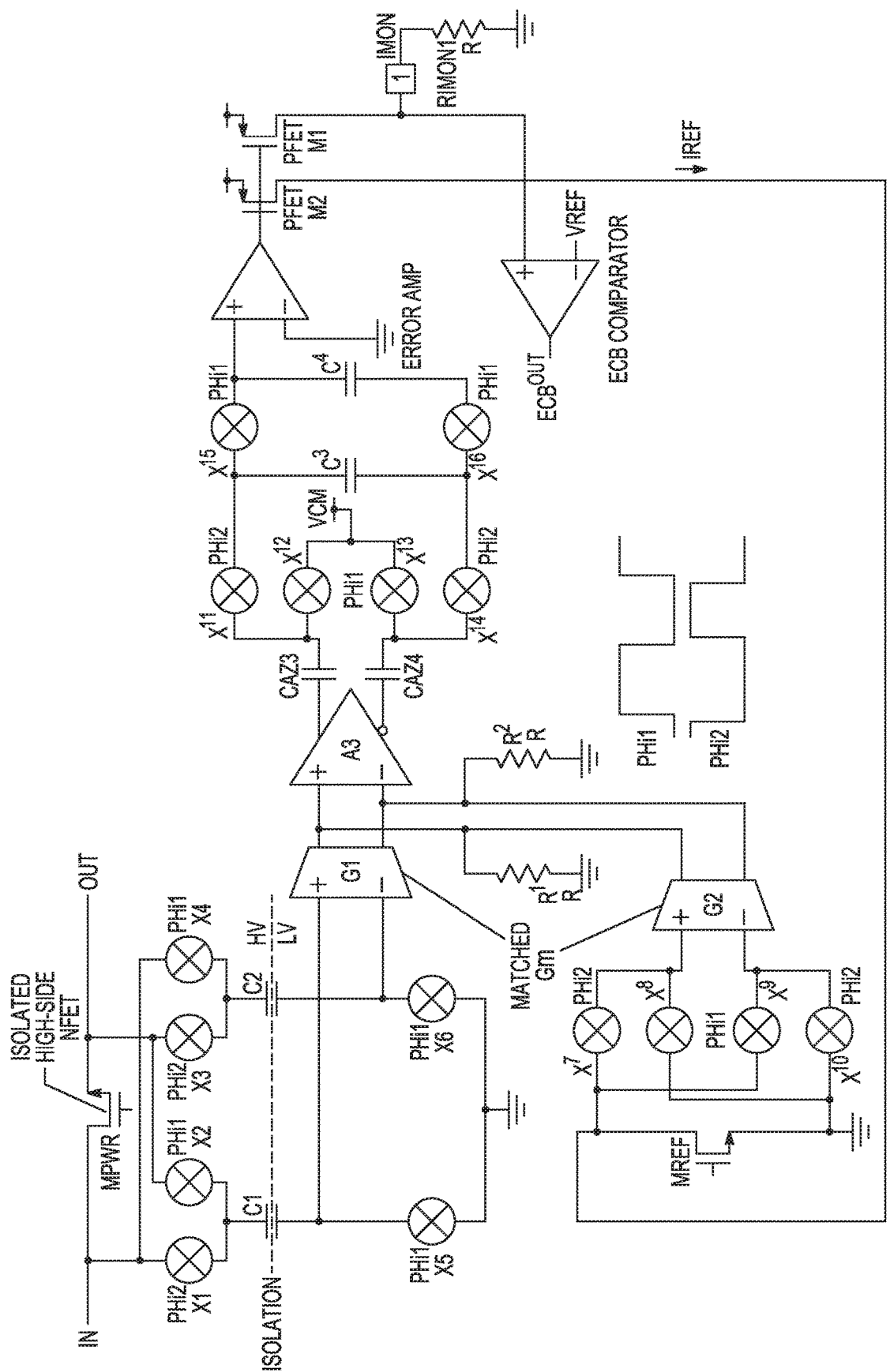
FIG. 6 is a circuit diagram of an example of an analog current monitor circuit.

FIG. 6 is a circuit diagram of an example of an analog current monitor circuit. The signal processing circuits of the example of FIG. 2 are used to drive a circuit loop to generate an analog current monitor output. The additional circuitry is shown in the box in the upper right of FIG. 6 and includes a differential to single-ended sample-hold circuit and an error amplifier. The differential to single-ended sample-hold and the error amplifier are used to drive the reference current in MREF so that the Vds of MPWR is substantially equal to the Vds of MREF, or $Vds,_{MPWR} = Vds,_{MREF}$. The analog monitor circuit includes two P-channel FETs M1 and M2. M2 generates the IREF applied to transistor MREF. PFET M1 matches PFET M2 and provides an analog current signal IMON proportional to the current of MPWR. The current can be converted to an analog voltage proportional to the current of MPWR. The analog voltage can be compared to a specified voltage threshold (e.g., VREF) using a comparator (ECB comparator). The output of the comparator can then be used to turn transistor MPWR off in the event of a fault.

Figure 7:
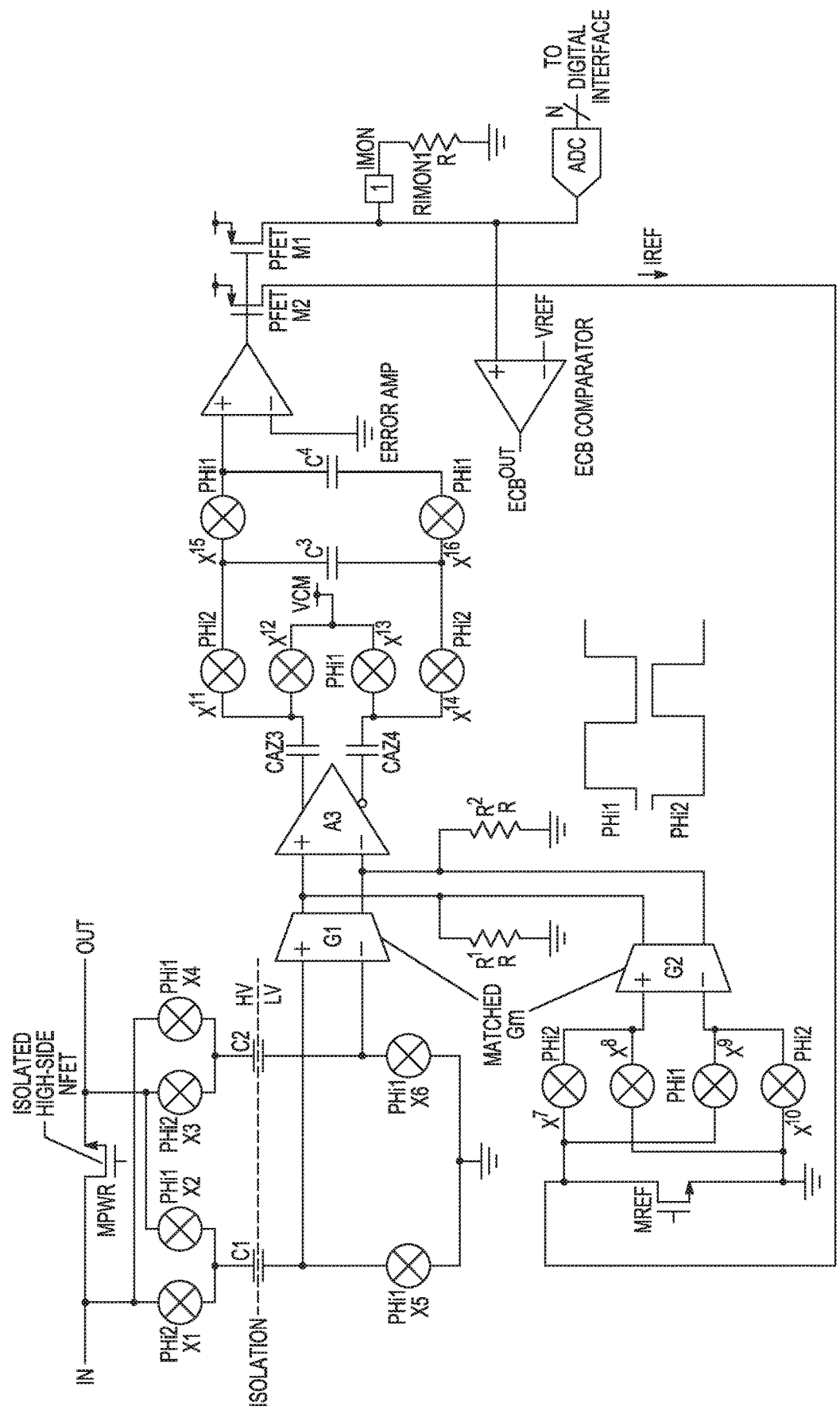
FIG. 7 is a circuit diagram of an example of a digital current monitor circuit.

FIG. 7 is a circuit diagram of an example of a digital current monitor circuit. The digital current monitor circuit digitizes the analog current signal IMON and provides a digital code proportionate to the current of MPWR. The digital current monitor circuit includes an analog-to-digital converter (ADC) circuit to convert the analog current signal IMON to the digital code which can be provided to a digital interface. The ADC circuit may be an integrating ADC, sigma-delta ADC, or a successive approximation register (SAR) ADC. The output of the ECB comparator or the digital code can be used to turn transistor MPWR off in the event of a fault.

The circuit examples described previously herein have included a fixed current threshold to implement the ECB function and the circuit monitor function. While scaling the ratio of the MPWR transistor and the matched MREF transistor using a fixed IREF in the example of FIG. 2 establishes a fixed electronic circuit breaker threshold, it is possible to make the electronic circuit breaker threshold variable by using a variable IREF. If the IREF current source is implemented as a current digital-to-analog (DAC) circuit, a variable threshold can be implemented by the corresponding variable Vds across the reference device MREF. This variable threshold modifies the trip point of the ECB and by adjusting the digital code controlling the IREF current DAC, the threshold of the ECB can be adjusted real-time in the end application.

The example of FIG. 6 includes a current monitor with the ECB. In FIG. 6, the RMON1 resistor sets the trip point of the EGB as well as the scaling of the analog output voltage proportional to the current through the MPWR switch. By replacing RMON1 with an analog or digitally adjustable resistance, it is possible to implement a programmable trip threshold in the current monitor circuit of FIG. 6.

Another approach to making the trip threshold of an ECB adjustable is to implement switch segmentation of one or both of the MPWR transistor and the MREF transistor. Segmentation is possible by dividing MPWR into an array of individual transistor devices and providing independent switch control of the independent gates of the individual transistor devices. For example, the segmented MPWR transistor can be composed of sixteen individual devices with the source and drain contacts connected to the IN and OUT nodes of the ECB. The gates of these individual devices can each be driven by a drive circuit shown in the example of FIG. 4. The segmented transistors and portions of the drive circuits are included in the HV domain. Using individual drive circuits makes it possible to turn on fractions of MPWR transistor using the ENGATE signal to effectively make the drain-to-source on resistance (Rds-on) of the MPWR programmable. The enabling and disabling of the individual devices provides altering the Rds-on of the MPWR and altering the area ratio of MPWR/MREF which alters the trip threshold.

Figure 8A:
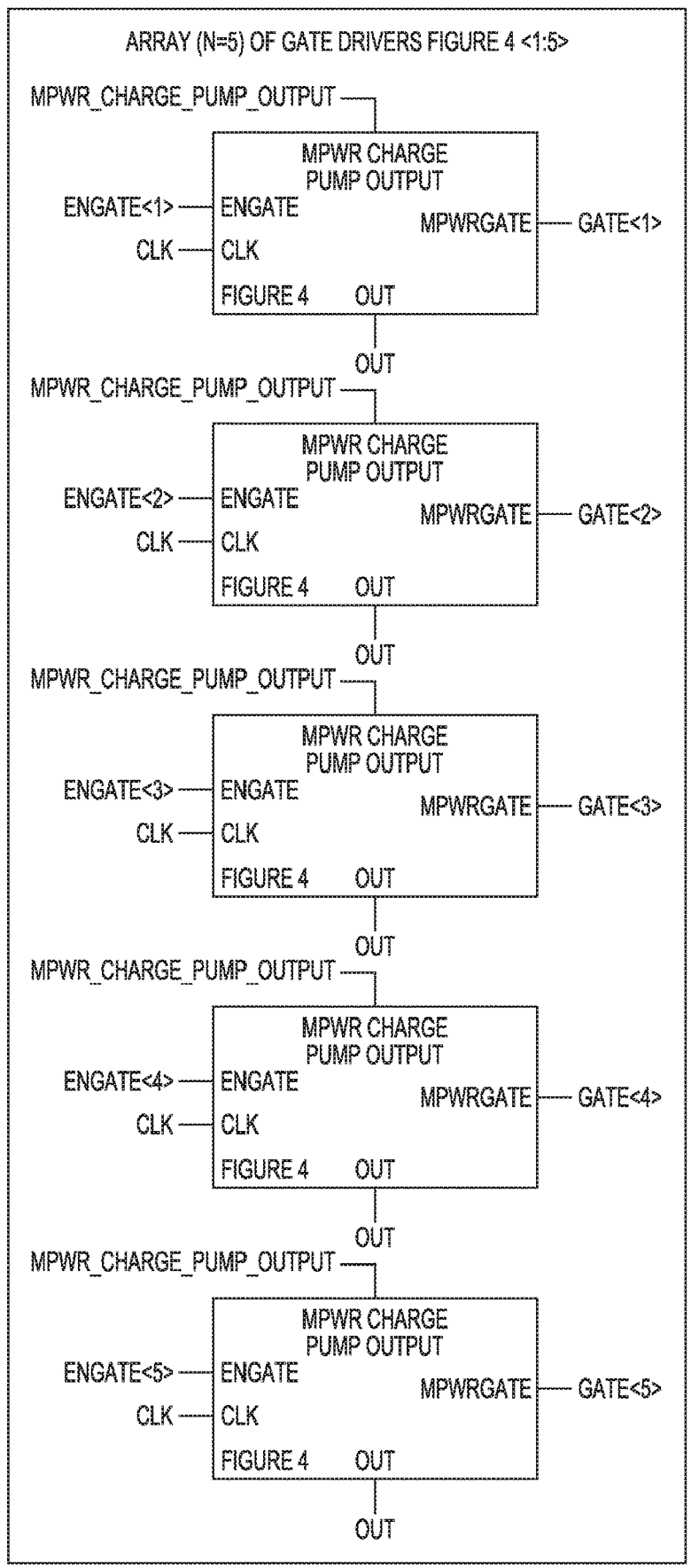
FIGS. 8A and 8B show an example of segmentation of a transistor.
Figure 8B:
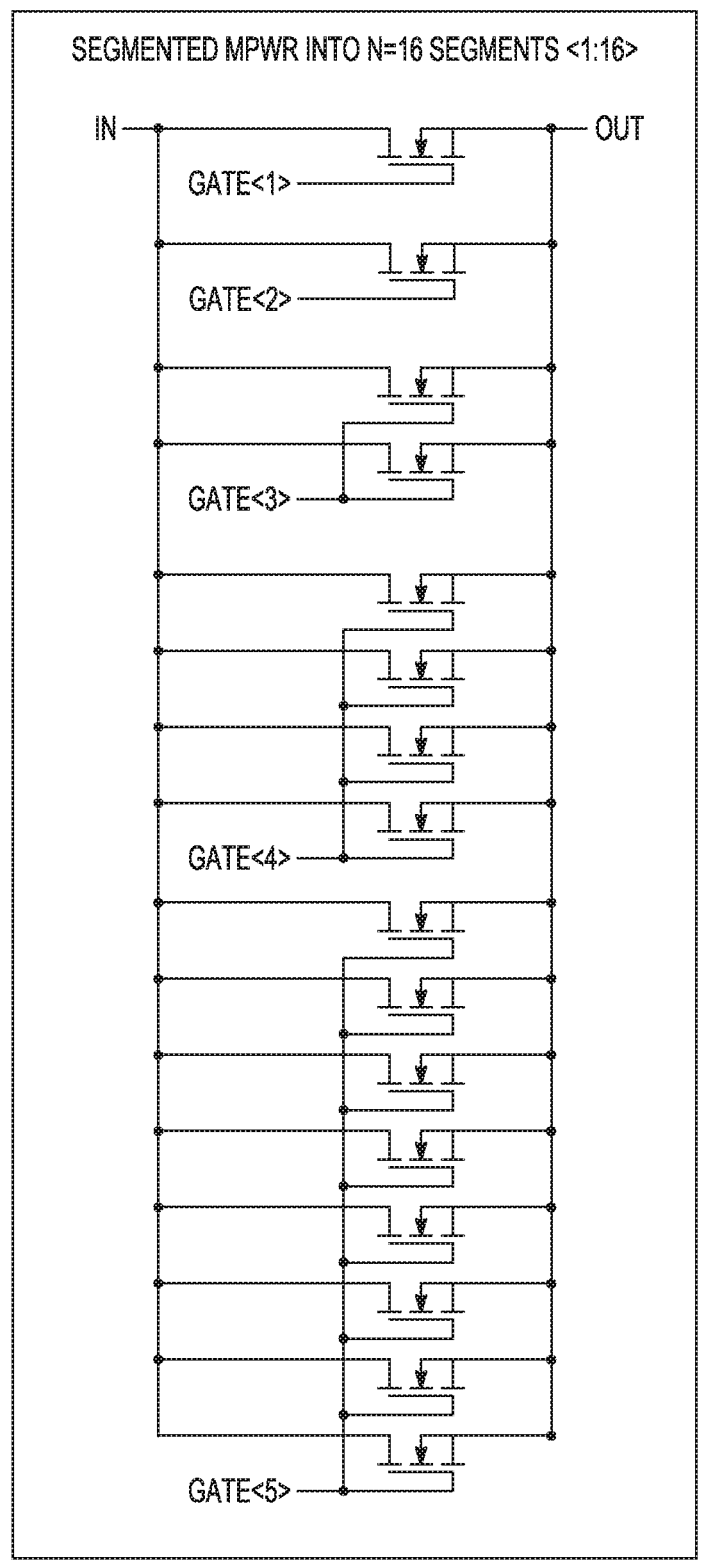

FIGS. 8A and 8B show an example of segmentation of the MPWR transistor. In FIG. 8B, sixteen individual devices are connected between node IN and OUT as five segments of devices. The five segments are weighted. The first segment and the second segment each include one individually gated transistor device (gate<1> or gate<2>). The third segment includes two transistors devices controlled by one gate signal gate<3>, the fourth segment includes four transistors controlled by one gate signal gate<4>, and the fifth segment includes eight transistors controlled by one gate signal gate<5>.

FIG. 8A shows five instances of the drive circuit of FIG. 4. One instance of the drive circuit is used to (hive one of the five segments of the MPWR transistor of FIG. 8B. The switch control of FIGS. 8A and 8B is as follows.

1) One instance of the drive circuit is used to provide signal gate<1> to drive the first MPWR segment to achieve the ability to turn-on and turn-off $\frac{1}{16}$ of the segmented MPWR transistor.
2) The second instance of the drive circuit is used to provide signal gate<2> to drive the device of the second MPWR segment to achieve the ability to turn-on and turn-off $\frac{1}{16}$ of the segmented MPWR transistor. The first and second MPWR segments can be turned-on and turned off together to control $\frac{2}{16}$ or $\frac{1}{8}$ of the MPWR.
3) The third instance of the drive circuit is used to provide signal gate<3> to drive the two devices of the third MPWR segment to achieve the ability to turn-on and turn-off $\frac{2}{16}$ of the segmented MPWR transistor. The first, second, and third MPWR segments can be turned-on and turned-off together to control $\frac{4}{16}$ or $\frac{1}{4}$ of the MPWR.
4) The fourth instance of the drive circuit is used to provide signal gate<4> to drive the four devices of the fourth MPWR segment to achieve the ability to turn-on and turn-off $\frac{4}{16}$ of the segmented MPWR transistor. The first, second, third, and fourth MPWR segments can be turned-on and turned-off to control $\frac{8}{16}$ or $\frac{1}{2}$ of the MPWR.
5) The fifth instance of the drive circuit is used to provide signal gate<5> to drive the eight devices of the fifth MPWR segment to achieve the ability to turn-on and turn-off $\frac{8}{16}$ of the segmented. MPWR transistor. The first through fifth MPWR segments can be turned-on and turned-off together to control $\frac{16}{16}$ or 100% of the MPWR.

The switch control and weighted segmentation of MPWR of FIGS. 8A and 8B provides a log-controlled weight of Rds-on of the segmented MPWR transistor to achieve a high dynamic range. It also reduces the number of instances of the drive circuit of FIG. 4 needed from sixteen if each of the 16 devices is individually controlled.

An additional benefit of reducing the area of the MPWR transistor (e.g., by segmenting) is to increase the imposed voltage drop for a given channel current. For smaller current thresholds, the corresponding Vds of MPWR is reduced which reduces the signal level to be compared with Vds of MREF. By engaging a fraction of MPWR, the Vds of MPWR is increased, which proportionately increases the voltage signal level at the input of amplifier G1 in the example of FIG. 2. Thus, the accuracy is maintained at lower threshold trip currents. The ECB architecture that uses a combination of a programmable current DAC for IREF and programmable switch segmentation is capable of a much larger operating dynamic range while maintaining accuracy over the operating range. Segmentation of the MREF transistor is possible as well, which may be used as an additional means of adjustment of the trip threshold.

Figure 9:
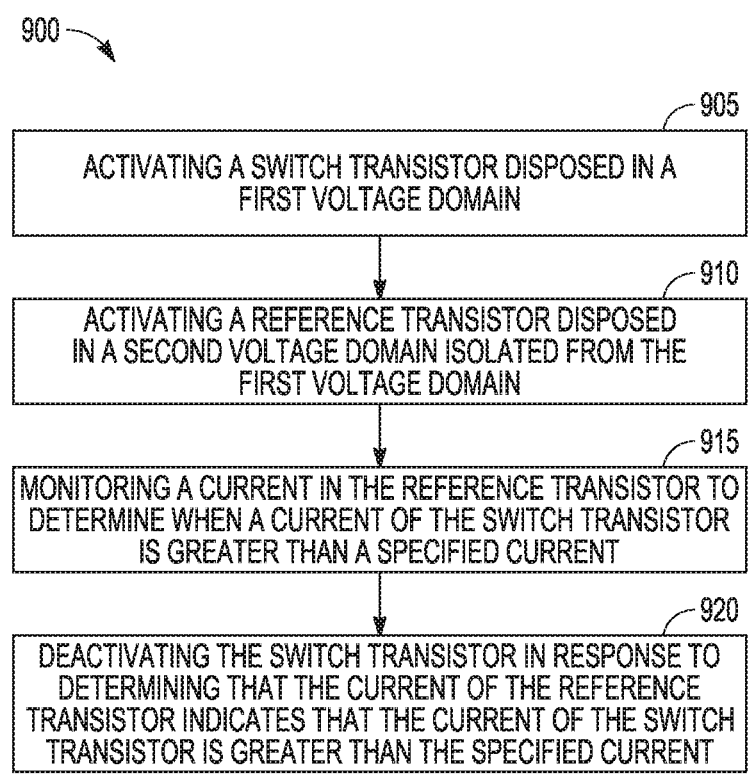
FIG. 9 is a flow diagram of an example of a method of controlling operation of an ECB circuit.

For completeness, FIG. 9 is a flow diagram of an example of a method 900 of controlling operation of an ECB circuit. At 905, a switch transistor disposed in a first voltage domain is activated. The first voltage domain can be the HV domain in the example circuits of the Figures and the switch transistor can be an isolated NFET. The transistor is activated by applying a gate voltage to the gate region of the switch transistor. At 910, a reference transistor is activated by applying a gate voltage to the gate region of the reference transistor. The reference transistor is disposed in a second voltage domain isolated from the first voltage domain. The reference transistor may be of a size that is a predetermined ratio of the switch transistor.

At 915, a current in the reference transistor is monitored to determine when a current of the switch transistor is greater than a specified current. The current may be a fault trip current that is associated with a circuit fault. At 920, the switch transistor is turned off in response to determining that the current in the reference transistor indicates that the current of the switch transistor is greater than the specified current.

According to some aspects, the Vds of the switch transistor and the Vds of the reference transistor are monitored as in the circuit examples of FIGS. 2 and 5. A reference current is applied to reference transistor. The reference current is the same ratio 1/α to the specified trip point current as the size ratio of the two transistors. The Vds of the reference transistor equals the Vds of the switch transistor when the current of the switch transistor is a times the reference current.

According to some aspects, an error amplifier is used to set the reference current in the reference transistor so that the Vds of the reference transistor tracks the Vds of the switch transistor. The Vds of the reference transistor is monitored and compared to trip point voltage corresponding to the trip point current of the switch transistor. When the monitored voltage exceeds the trip point voltage, the current in the switch transistor exceeds the specified current, and the switch transistor is turned off.

The devices, systems and methods described herein provide current monitoring circuits that are agnostic to the common mode voltage of the current path being sensed. This allows the devices and systems described to be easily adaptable to any application by changing only a few circuit components. Additionally, the voltage drop and power dissipation associated with a current sense resistor is eliminated.

ADDITIONAL DESCRIPTION AND ASPECTS

A first Aspect (Aspect 1) includes subject matter (such as a current monitor circuit) comprising a sense transistor disposed in a first voltage domain, a reference transistor disposed in a second voltage domain isolated from the first voltage domain, and sensing circuitry disposed in the second voltage domain and configured to determine if a current of the sense transistor is greater than or less than a specified current using a current in the reference transistor.

In Aspect 2, the subject matter of Aspect 1 optionally includes sensing circuitry that includes a switched capacitor circuit configured to sample a drain-to-source voltage (Vds) of the sense transistor, and comparison circuitry disposed in the second voltage domain and configured to determine if the sampled Vds of the sense transistor is greater than or less than a Vds of the reference transistor.

In Aspect 3, the subject matter of Aspect 2 optionally includes an adjustable current source that applies a reference current to the reference transistor to generate an adjustable Vds of the reference transistor.

In Aspect 4, the subject matter of one or any combination of Aspects 1-3 optionally includes sensing circuitry configured to generate a voltage that is proportional to the current of the sense transistor and compare the generated voltage to a specified voltage to determine if the current in the sense transistor is greater than or less than the specified current.

In Aspect 5, the subject matter of one or any combination of Aspects 1-4 optionally includes sensing circuitry configured to a switched capacitor circuit configured to sample a drain-to-source voltage (Vds) of the sense transistor; an error amplifier disposed in the second voltage domain and configured to adjust a current of a reference transistor to match a Vds of the reference transistor to the Vds of the sense transistor; and comparison circuitry configured to determine if the current of the reference transistor is greater than or less than the specified current.

In Aspect 6, the subject matter of Aspect 5 optionally includes a resistive circuit element that generates a voltage using the current of the reference transistor; comparison circuitry configured to compare the generated voltage to a reference voltage to implement a trip threshold indicating when the current of the reference transistor is greater than the specified current; and the resistive circuit element is optionally adjustable to implement a programmable trip threshold.

In Aspect 7, the subject matter of one or any combination of Aspects 1-6 optionally includes a switched capacitor circuit configured to sample a drain-to-source voltage (Vds) of the sense transistor; and an analog-to-digital converter (ADC) circuit to generate a digital value proportional to the current in the sense transistor and compare the digital value to a specified digital value to determine if the current in the sense transistor is greater than or less than the specified current.

In Aspect 8, the subject matter of one or any combination of Aspects 1-7 optionally includes the sense transistor being a segmented transistor comprised of different transistor segments weighted by size and the different transistor segments are activated independently.

In Aspect 9, the subject matter of one or any combination of Aspects 1-8 optionally includes the sense transistor being a switch transistor, and the sensing circuitry includes a comparator that generates a fault signal used to turn off the sense transistor when the current of the sense transistor is greater than the specified current.

Aspect 10 includes subject matter (such as electronic circuit breaker (ECB) circuit) or can optionally be combined with one or any combination of Aspects 1-9 to include such subject matter, comprising a switch transistor disposed in a first voltage domain, a reference transistor disposed in a second voltage domain isolated from the first voltage domain, and sensing circuitry configured to determine if a current of the switch transistor is greater than or less than a specified current using a current in the reference transistor, and turn off the switch transistor when the current in the reference transistor indicates that the current of the switch transistor is greater than the specified current.

In Aspect 11, the subject matter of Aspect 10 optionally includes sensing circuitry configured to generate a voltage that is proportional to the current of the switch transistor and compare the generated voltage to a specified voltage to determine when the current in the switch transistor is greater than the specified current.

In Aspect 12, the subject matter of one or both of Aspects 10 and 11 optionally includes sensing circuitry including a switched capacitor circuit configured to sample a drain-to-source voltage (Vds) of the sense transistor, and comparison circuitry disposed in the second voltage domain. The comparison circuitry is configured to determine if the sampled Vds of the switch transistor is greater than or less than a Vds of the reference transistor, and turn off the switch transistor when the sampled Vds of the switch transistor is greater than the Vds of the reference transistor.

In Aspect 13, the subject matter of one or any combination of Aspect 12 optionally includes a switched capacitor circuit that includes isolation capacitors disposed in the first voltage domain; a first transconductance amplifier disposed in the second voltage domain to receive the sampled Vds of the switch transistor from the isolation capacitors; a second transconductance amplifier disposed in the second voltage domain to receive the Vds of the reference transistor; and includes comparison circuitry that includes a differential amplifier including a first input operatively coupled to the first transconductance amplifier, a second input operatively coupled to the second transconductance amplifier, and a differential output; and a comparator circuit coupled to the differential output of the differential amplifier. In Aspect 14, the subject matter of Aspect 12 optionally includes a switched capacitor circuit that includes a first pair of sampling capacitors disposed in the first voltage domain that sample the Vds of the switch transistor; a second pair of sampling capacitors disposed in the second voltage domain that sample the Vds of the reference transistor; and comparison circuitry that includes a differential amplifier including includes a differential input coupled to the first and second pair of sampling capacitors, and a differential output; and a comparator circuit coupled to the differential output of the differential amplifier.

In Aspect 15, the subject matter of one or any combination of Aspects 10-14 optionally includes a programmable current source that applies a reference current to the reference transistor to generate an adjustable Vds of the reference transistor; and a switch transistor that is a segmented transistor comprised of different transistor segments weighted by size and activation of the different transistor segments is programmable.

Aspect 16 includes subject matter (such as a method of controlling operation of an electronic circuit breaker (ECB) circuit) or can optionally be combined with one or any combination of Aspects 1-15 to include such subject flatter, comprising activating a switch transistor disposed in a first voltage domain; activating a reference transistor disposed in a second voltage domain isolated from the first voltage domain; monitoring a current of the reference transistor to determine when a current of the switch transistor is greater than a specified current; and deactivating the switch transistor in response to determining that the current of the reference transistor indicates that the current of the switch transistor is greater than the specified current.

In Aspect 17, the subject matter of Aspect 16 optionally includes generating a voltage that is proportional to the current of the switch transistor and comparing the generated voltage to a specified voltage to determine when the current in the switch transistor is greater than the specified current.

In Aspect 18, the subject matter of one or both of Aspects 16 and 17 optionally include sampling a drain-to-source voltage (Vds) of the sense transistor; determining if the sampled Vds of the switch transistor is greater than or less than a Vds of the reference transistor; and deactivating the switch transistor when the sampled Vds of the switch transistor is greater than the Vds of the reference transistor.

In Aspect 19, the subject matter of Aspect 18 optionally includes sampling the Vds of the switch capacitor onto isolation capacitors disposed in the first voltage domain; applying the sampled Vds to a first transconductance amplifier disposed in the second voltage domain; applying the Vds of the reference transistor to a second transconductance amplifier disposed in the second voltage domain; applying the outputs of the first and second transconductance amplifiers to a differential input of a differential amplifier to generate a differential output voltage representative of a difference between the Vds of the switch capacitor and the Vds of the reference transistor; and deactivating the switch transistor when the differential output voltage indicates the Vds of the switch transistor is greater than the Vds of the reference transistor.

In Aspect 20, the subject matter of Aspect 18 optionally includes sampling the Vds of the switch transistor onto a first pair of sampling capacitors disposed in the first voltage domain; sampling the Vds of the reference transistor onto a second pair of sampling capacitors disposed in the second voltage domain; applying the sampled Vds of the first pair of sampling capacitors and the sampled Vds of the second pair of sampling capacitors to a differential input of a differential amplifier to generate a differential output voltage representative of a difference between the Vds of the switch capacitor and the Vds of the reference transistor; and deactivating the switch transistor when the differential output voltage indicates the Vds of the switch transistor is greater than the Vds of the reference transistor.

These non-limiting Aspects can be combined in any permutation or combination. The above detailed description includes references to the accompanying drawings, which form a part of the detailed description. The drawings show, by way of illustration, specific embodiments in which the invention can be practiced. These embodiments are also referred to herein as "examples." All publications, patents, and patent documents referred to in this document are incorporated by reference herein in their entirety, as though individually incorporated by reference. In the event of inconsistent usages between this document and those documents so incorporated by reference, the usage in the incorporated reference(s) should be considered supplementary to that of this document; for irreconcilable inconsistencies, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A" and unless otherwise indicated. In the appended claims, the terms "including" and "in which" are used as the plain-English equivalents of the respective terms "comprising" and "wherein." Also, in the following claims, the terms "including" and "comprising" are open-ended, that is, a system, device, article, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects. Method examples described herein can be machine or computer-implemented at least in part.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description, with each claim standing on its own as a separate embodiment. The scope of the invention should be determined with reference to the appended claims, along with the full scope of equivalents to which such claims are entitled.

What is claimed is:

1. A current monitor circuit comprising:
   a sense transistor disposed in a first voltage domain, wherein current to a circuit load is provided by the sense transistor;
   a reference transistor disposed in a second voltage domain isolated from the first voltage domain; and
   sensing circuitry disposed in the second voltage domain and configured to determine if a current of the sense transistor is greater than or less than a specified current using a drain-to-source voltage (Vds) of the sense transistor and a current in the reference transistor and set the sense transistor to an on state or off state according to the current determination.

2. The current monitor circuit of claim 1, wherein the sensing circuitry includes:
   a switched capacitor circuit configured to sample the Vds of the sense transistor; and
   comparison circuitry disposed in the second voltage domain and configured to determine if the sampled Vds of the sense transistor is greater than or less than a Vds of the reference transistor.

3. The current monitor circuit of claim 2, including an adjustable current source that applies a reference current to the reference transistor to generate an adjustable Vds of the reference transistor.

4. The current monitor circuit of claim 1, wherein the sensing circuitry is configured to generate a voltage that is proportional to the current of the sense transistor and compare the generated voltage to a specified voltage to determine if the current in the sense transistor is greater than or less than the specified current.

5. The current monitor circuit of claim 1, wherein the sensing circuitry includes:
   a switched capacitor circuit configured to sample the Vds of the sense transistor;
   an error amplifier disposed in the second voltage domain and configured to adjust a current of a reference transistor to match a Vds of the reference transistor to the Vds of the sense transistor; and
   comparison circuitry configured to determine if the current of the reference transistor is greater than or less than the specified current.

6. The current monitor circuit of claim 5, including:
   a resistive circuit element that generates a voltage using the current of the reference transistor;
   wherein the comparison circuitry is configured to compare the generated voltage to a reference voltage to implement a trip threshold indicating when the current of the reference transistor is greater than the specified current; and
   wherein the resistive circuit element is adjustable to implement a programmable trip threshold.

7. The current monitor circuit of claim 1, wherein the sensing circuitry includes:
   a switched capacitor circuit configured to sample the Vds of the sense transistor; and
   an analog-to-digital converter (ADC) circuit to generate a digital value proportional to the current in the sense transistor and compare the digital value to a specified digital value to determine if the current in the sense transistor is greater than or less than the specified current.

8. The current monitor circuit of claim 1, wherein the sense transistor is a segmented transistor comprised of different transistor segments weighted by size and the different transistor segments are activated independently.

9. The current monitor circuit of claim 1, wherein the sense transistor is a switch transistor, and the sensing circuitry includes a comparator that generates a fault signal used to turn off the sense transistor when the current of the sense transistor is greater than the specified current.

10. An electronic circuit breaker (ECB) circuit comprising:
    a switch transistor disposed in a first voltage domain, wherein current to a circuit load is provided by the switch transistor;
    a reference transistor disposed in a second voltage domain isolated from the first voltage domain; and
    sensing circuitry configured to:
    determine if a current of the switch transistor is greater than or less than a specified current using a drain-to-source voltage (Vds) of the switch transistor and a current in the reference transistor; and
    turn off the switch transistor when the current in the reference transistor indicates that the current of the switch transistor is greater than the specified current.

11. The ECB circuit of claim 10, wherein the sensing circuitry is configured to generate a voltage that is proportional to the current of the switch transistor and compare the generated voltage to a specified voltage to determine when the current in the switch transistor is greater than the specified current.

12. The ECB circuit of claim 10, wherein the sensing circuitry includes:
    a switched capacitor circuit configured to sample the Vds of the sense transistor; and
    comparison circuitry disposed in the second voltage domain and configured to:
    determine if the sampled Vds of the switch transistor is greater than or less than a Vds of the reference transistor; and
    turn off the switch transistor when the sampled Vds of the switch transistor is greater than the Vds of the reference transistor.

13. The ECB circuit of claim 12,
    wherein the switched capacitor circuit includes:
    isolation capacitors disposed in the first voltage domain;
    a first transconductance amplifier disposed in the second voltage domain to receive the sampled Vds of the switch transistor from the isolation capacitors; and
    a second transconductance amplifier disposed in the second voltage domain to receive the Vds of the reference transistor; and
    wherein the comparison circuitry includes:
    a differential amplifier including a first input operatively coupled to the first transconductance amplifier, a second input operatively coupled to the second transconductance amplifier, and a differential output; and
    a comparator circuit coupled to the differential output of the differential amplifier.

14. The ECB circuit of claim 12,
    wherein the switched capacitor circuit includes:
    a first pair of sampling capacitors disposed in the first voltage domain that sample the Vds of the switch transistor;

a second pair of sampling capacitors disposed in the second voltage domain that sample the Vds of the reference transistor;

wherein the comparison circuitry includes:

a differential amplifier including includes a differential input coupled to the first and second pair of sampling capacitors, and a differential output; and a comparator circuit coupled to the differential output of the differential amplifier.

15. The ECB circuit of claim 10, including a programmable current source that applies a reference current to the reference transistor to generate an adjustable Vds of the reference transistor; and wherein the switch transistor is a segmented transistor comprised of different transistor segments weighted by size and activation of the different transistor segments is programmable.

16. A method of controlling operation of an electronic circuit breaker (ECB) circuit, the method comprising:

activating a switch transistor disposed in a first voltage domain, wherein current to a circuit load is provided by the switch transistor;

activating a reference transistor disposed in a second voltage domain isolated from the first voltage domain;

monitoring a current of the reference transistor and a drain-to-source voltage (Vds) of the switch transistor to determine when a current of the switch transistor is greater than a specified current; and deactivating the switch transistor in response to determining that the current of the reference transistor indicates that the current of the switch transistor is greater than the specified current.

17. The method of claim 16, including generating a voltage that is proportional to the current of the switch transistor and comparing the generated voltage to a specified voltage to determine when the current in the switch transistor is greater than the specified current.

18. The method of claim 16, including:

sampling the Vds of the sense transistor;

determining if the sampled Vds of the switch transistor is greater than or less than a Vds of the reference transistor; and deactivating the switch transistor when the sampled Vds of the switch transistor is greater than the Vds of the reference transistor.

19. The method of claim 18, including:

sampling the Vds of the switch capacitor onto isolation capacitors disposed in the first voltage domain;

applying the sampled Vds to a first transconductance amplifier disposed in the second voltage domain;

applying the Vds of the reference transistor to a second transconductance amplifier disposed in the second voltage domain;

applying the outputs of the first and second transconductance amplifiers to a differential input of a differential amplifier to generate a differential output voltage representative of a difference between the Vds of the switch capacitor and the Vds of the reference transistor; and deactivating the switch transistor when the differential output voltage indicates the Vds of the switch transistor is greater than the Vds of the reference transistor.

20. The method of claim 18, including sampling the Vds of the switch transistor onto a first pair of sampling capacitors disposed in the first voltage domain;

sampling the Vds of the reference transistor onto a second pair of sampling capacitors disposed in the second voltage domain;

applying the sampled Vds of the first pair of sampling capacitors and the sampled Vds of the second pair of sampling capacitors to a differential input of a differential amplifier to generate a differential output voltage representative of a difference between the Vds of the switch capacitor and the Vds of the reference transistor; and deactivating the switch transistor when the differential output voltage indicates the Vds of the switch transistor is greater than the Vds of the reference transistor.

* * * * *